(12) United States Patent
Farkas et al.

(10) Patent No.: US 12,519,271 B2
(45) Date of Patent: Jan. 6, 2026

(54) FACTORY CONFIGURABLE CONNECTOR IMPEDANCE

(71) Applicant: DELL PRODUCTS L.P., Round Rock, TX (US)

(72) Inventors: Sandor Farkas, Round Rock, TX (US); Mark Smith, Georgetown, TX (US); Bhyrav Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 758 days.

(21) Appl. No.: 17/723,467

(22) Filed: Apr. 19, 2022

(65) Prior Publication Data

US 2023/0335952 A1    Oct. 19, 2023

(51) Int. Cl.

| | |
|---|---|
| *H01R 13/6474* | (2011.01) |
| *H01R 13/6581* | (2011.01) |
| *H01R 27/00* | (2006.01) |
| *H01R 43/20* | (2006.01) |
| *H05K 1/02* | (2006.01) |
| *H05K 3/32* | (2006.01) |
| *H01R 12/57* | (2011.01) |
| *H01R 12/58* | (2011.01) |

(52) U.S. Cl.
CPC ..... *H01R 13/6474* (2013.01); *H01R 13/6581* (2013.01); *H01R 27/00* (2013.01); *H01R 43/205* (2013.01); *H05K 1/0213* (2013.01); *H05K 3/32* (2013.01); *H01R 12/57* (2013.01); *H01R 12/58* (2013.01); *H05K 2201/10189* (2013.01)

(58) Field of Classification Search
None
See application file for complete search history.

(56) References Cited

U.S. PATENT DOCUMENTS

| | | | | |
|---|---|---|---|---|
| 4,878,858 A | * | 11/1989 | Dechelette | H01R 13/6582 439/607.38 |
| 6,007,379 A | * | 12/1999 | Michaelis | H01R 13/6594 439/607.04 |
| 7,922,534 B2 | * | 4/2011 | Lin | H01R 13/659 439/607.53 |
| 8,425,250 B2 | * | 4/2013 | Kagotani | H01R 12/7005 439/680 |
| 9,595,793 B2 | | 3/2017 | Masunaga | |
| 9,893,448 B2 | | 2/2018 | Mashima et al. | |

* cited by examiner

*Primary Examiner* — Felix O Figueroa
(74) *Attorney, Agent, or Firm* — Larson Newman, LLP

(57) ABSTRACT

A connector includes a connector core and ant outer shell. The connector core includes a plurality of contacts for coupling a device to a PCB, The connector core exhibits a first impedance for signals provided on the contacts. The outer shell is configured to be rigidly attached to the connector core. When the outer shell has a first configuration and is attached to the connector core, the connector exhibits a second impedance for signals provided on the contacts, the second impedance being different from the first impedance. When the outer shell has a second configuration and is attached to the connector core, the connector exhibits a third impedance for signals provided on the contacts, the third impedance being different from the first and second impedances.

16 Claims, 5 Drawing Sheets

Impedance "A"

FACTORY CONFIGURABLE CONNECTOR IMPEDANCE

FIELD OF THE DISCLOSURE

This disclosure generally relates to information handling systems, and more particularly relates to configurable impedance device connectors.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A connector may include a connector core and ant outer shell. The connector core may include a plurality of contacts for coupling a device to a PCB, The connector core may exhibit a first impedance for signals provided on the contacts. The outer shell may be configured to be rigidly attached to the connector core. When the outer shell has a first configuration and is attached to the connector core, the connector may exhibit a second impedance for signals provided on the contacts, the second impedance being different from the first impedance. When the outer shell has a second configuration and is attached to the connector core, the connector may exhibit a third impedance for signals provided on the contacts, the third impedance being different from the first and second impedances.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
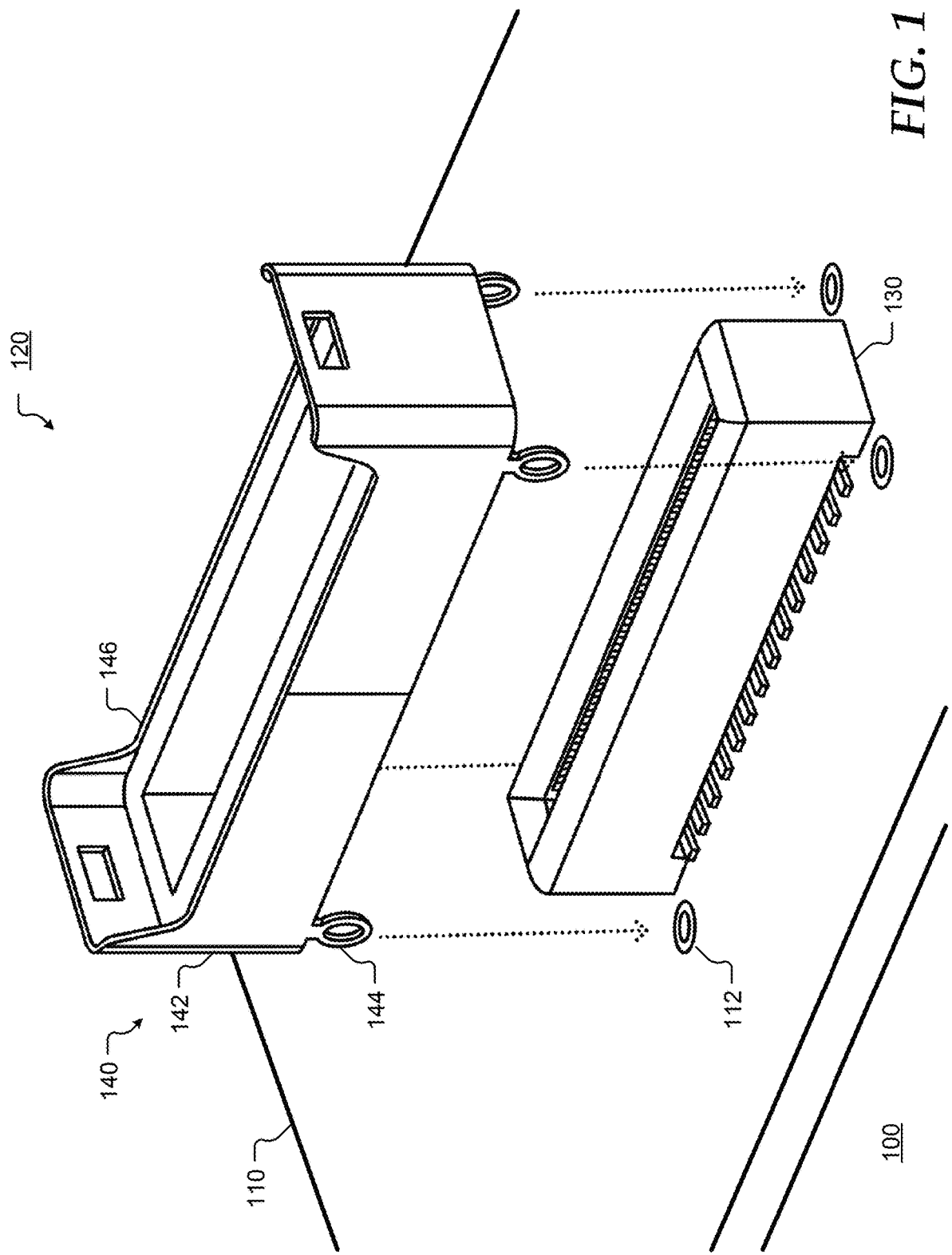
FIGS. 1-3 illustrate an information handling system including a connector housing with factory configurable connector impedance according to an embodiment of the current disclosure.
Figure 2:
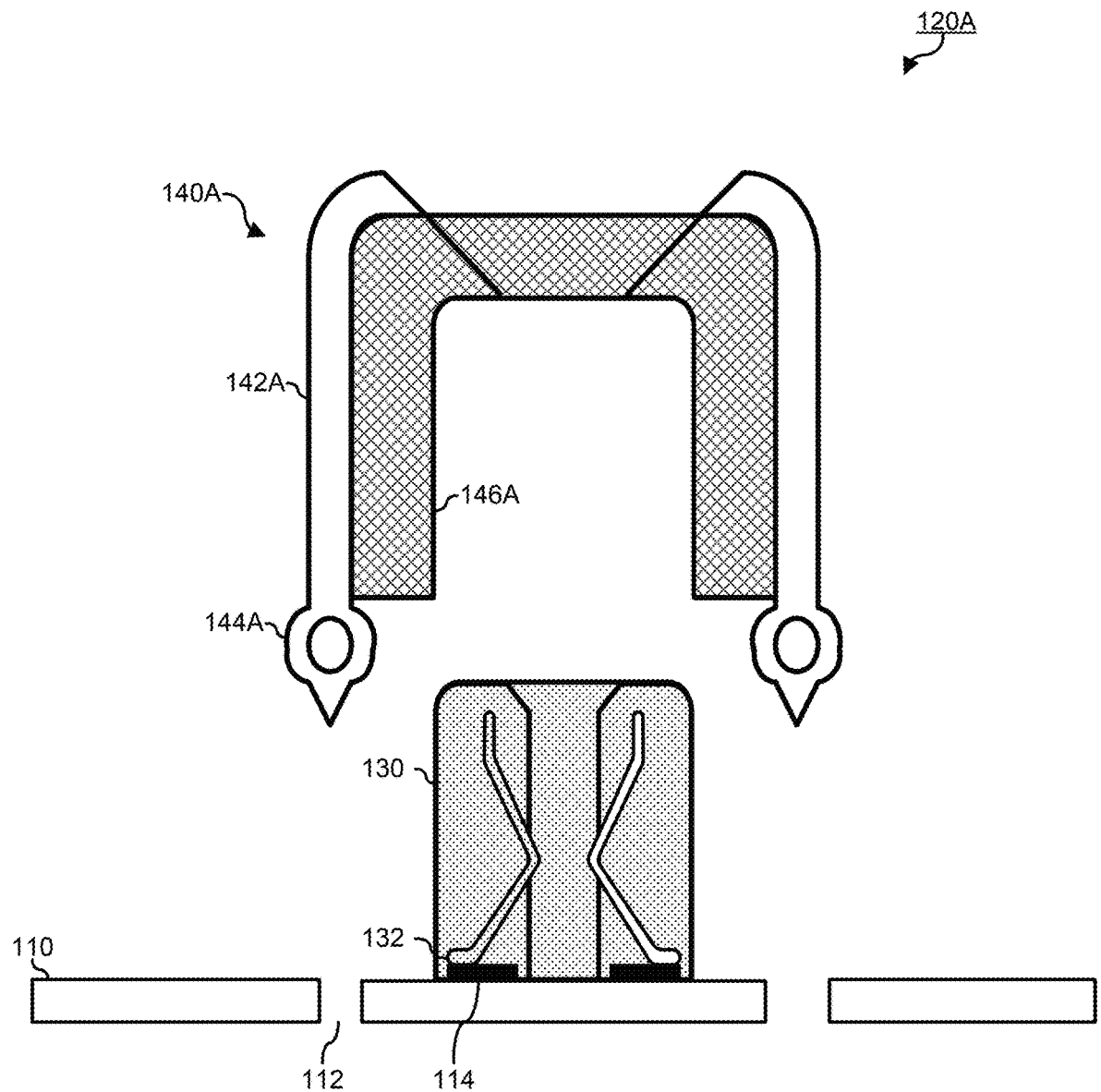
Figure 3:
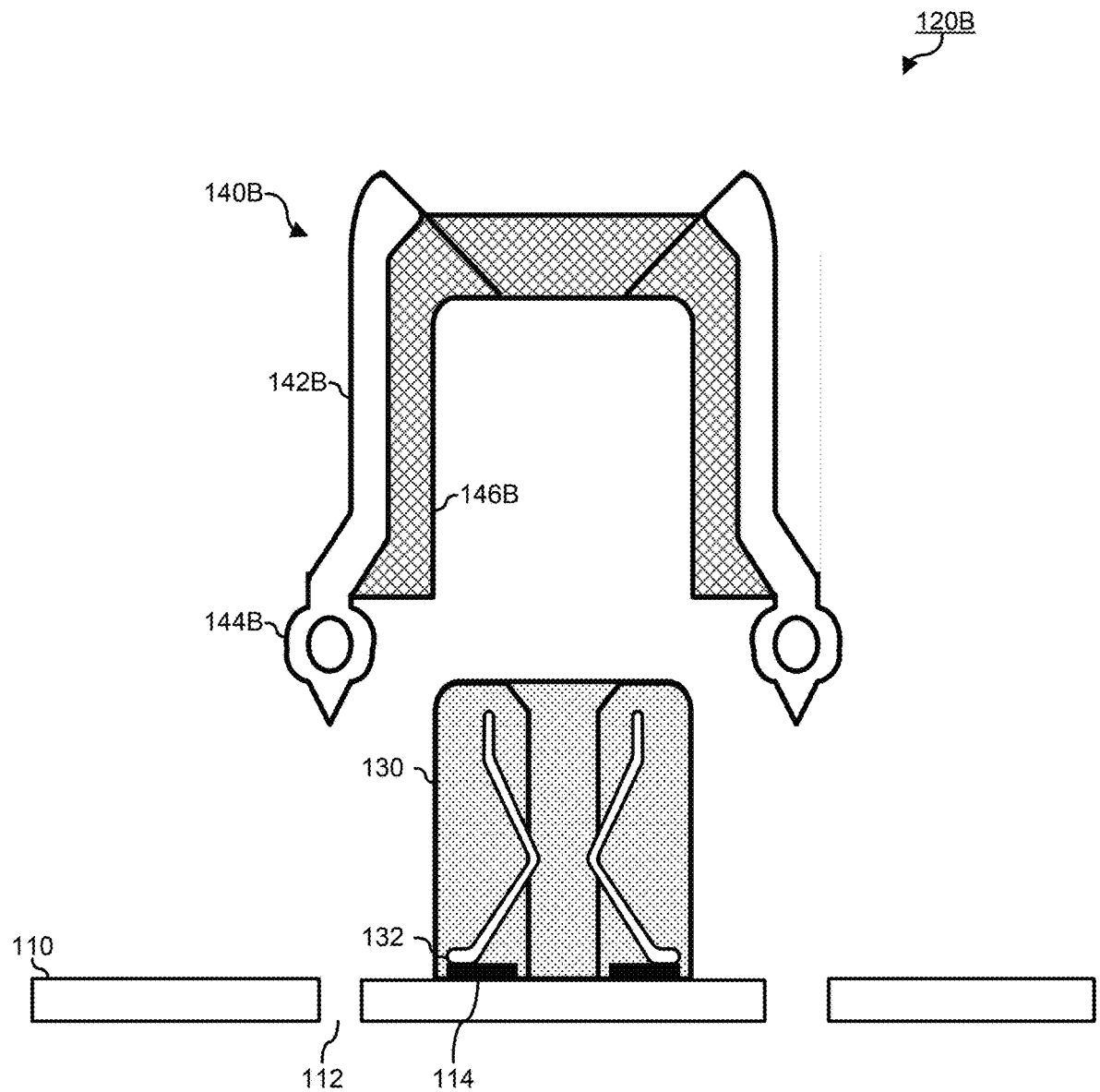

FIGS. 1-3 illustrate an information handling system 100 including a printed circuit board 110 and a connector 120 with factory configurable connector impedance. Connector 120 includes a connector core 130 and an outer shell 140. Information handling system 110 includes mounting holes 112 for mounting outer shell 140, and solder pads 114 (illustrated in FIGS. 2 and 3). Connector core 130 includes connector contacts 132 that are soldered to solder pads 114. Outer shell 140 includes a shield 142 with mounting extensions 144, and a dielectric shell 146.

Information handling system 100 represents an electronic or electrical device configured to provide a particular function, such as a computer system, a control system, or any other type of system that utilizes connectors with which to affix and electrically connect components or elements that are associated with the information handling system, but which are able to be separately attached to the information handling system. As such, connector 120 represents an attachment mechanism for affixing and electrically connecting the external components or elements to PCB 110. In a particular embodiment, connector 120 represents a card edge connector configured to receive an add-in card that has connection fingers on the surface of the add-in card that make an electrical connection with connector contacts 132 when the add-in card is inserted into the connector. In the description found hereinafter, connector 120 will be described in the context of a card edge connector. However, it should be understood that other types of connectors may utilize the teachings of the current disclosure, as needed or desired.

Referring now to FIGS. 2 and 3, in fabricating information handling system 100, connector core 130 is affixed to PCB 110. In a particular embodiment, connector core 130 represents a surface mount connector core. Here, PCB 110 includes a solder pad 114 for each connector contact 132 to electrically connect a particular circuit to the connector contact. In a surface mount process, each connector contact 132 is soldered to its associated solder pad 114, thereby securing the connector core to PCB 110. In another embodiment, connector core 130 represents a through-hole mount connector core. Here, PCB 110 includes through holes drilled into PCB 110 for each contact 132 to electrically connect a particular circuit to the connector contact. In a through-hole mount process, each connector contact 132 has a connector pin that is inserted into the associated through hole and that is soldered to it's associated through hole, thereby securing the connector core to the PCB. It will be understood that other types of attachment mechanism for affixing connector core 130 to PCB 110 may be utilized, as needed or desired.

Referring back to FIG. 1, after connector core 130 is affixed to PCB 110, outer shell 140 is installed over the connector core to complete the assembly of connector 120. In the illustrated embodiment, mounting holes 112 are located to correspond with the locations of mounting extensions 144, and, as outer shell 140 is installed over connector core 130, the mounting extensions are inserted into the mounting holes, and dielectric shell 146 is fitted onto connector core 130. Mounting extensions 144 are configured to provide a secure and snug fit into mounting holes 112, thereby completing the assembly of connector 120. In another embodiment, PCB 110 does not include mounting holes 112 and shield 142 does not include mounting extensions 144. Instead, connector core 130 and dielectric shell 146 each include complimentary snap-fit features, such that, when fully installed over connector core 130, outer shell 140 is retained on the connector core by the snap-fit features. Connector 120 may include other elements, as needed or desired. For example, connector 120 may include retainer features configured to retain the external component or element to the connector as needed or desired. In another example, connector 120 may include environmental protection features configured to protect the electrical connections formed with the connector from atmospheric damage.

High-speed data interfaces are typically designed to a specific channel impedance. For example PCIE/USB interfaces are designed with an 85 ohm channel impedance specification, Gigabit Ethernet is designed to a 95 ohm channel impedance specification, and SAS/SATA interfaces are designed to a 100 ohm channel impedance specification. As a result, integrated circuits are being designed that support multimode input/output (I/O) operations where the signaling protocol and channel impedance at the integrated circuit interface is selectable by software. Here, the integrated circuits are typically configured during the manufacturing process for the information handling system that incorporates the integrated circuit. In particular, a designer may select a particular type of interface to implement, and design the channel in accordance with the particular channel impedance specification. Then, in manufacturing, the integrated circuit I/O is configured to operate with the channel impedance that matches the designed channel.

However, connector manufacturers do not typically source connectors with a wide range of different impedance characteristics, but instead source connectors with a common "compromise" impedance. For example, connector manufacturers may typically source a single connector type for PCIE/USB interfaces, for Gigabit Ethernet interfaces, and for SAS/SATA interfaces. The single connector type may exhibit a 92 ohm impedance, meaning that the connector is not a perfect match for any of the interface types, but provides an "acceptable" impedance match for any type of interface. In the past, such a compromise solution has been sufficient to ensure good channel performance. However, as the speed of high-speed data interfaces is increasing, the impedance mismatch introduced by the connector is becoming a greater hindrance to channel performance.

In a particular embodiment, connector 120 is configured to provide a factory selectable impedance by virtue of being a two-piece connector (i.e., connector core 130 and outer shell 140). Here, connector core 130 is configured to provide a single base-level impedance value, and outer shell 140 represents multiple different outer shells that each provide a different custom-level impedance. For example, in order to satisfy the impedance requirements of for PCIE/USB interfaces, Gigabit Ethernet interfaces, and SAS/SATA interfaces, connector core 130 can be designed to have a standalone impedance of 110 ohm. Then a PCIE/USB-based outer shell 140, when combined with connector core 130, creates the required 85 ohm connector 120 for PCIE/USB interfaces. Likewise, a Gigabit Ethernet-based outer shell 140, when combined with connector core 130, creates the required 95 ohm connector 120 for Gigabit Ethernet interfaces. Finally, a SAS/SATA-based outer shell 140, when combined with connector core 130, creates the required 100 ohm connector 120 for SAS/SATA interfaces.

In a particular embodiment, the different versions of outer shell 140 are configured to provide different custom-level impedances based upon the material properties of dielectric shell 146. For example, by varying the dielectric constant of dielectric shell 146, different custom-level impedances can be created for the different versions of outer shell 140. In another embodiment, the different versions of outer shell 140 are configured with different profiles. For example, a first outer shell 140A is illustrated in FIG. 2, and a second outer shell 140B is illustrated in FIG. 3. Notice that the thickness of dielectric shell 146A is thicker than dielectric shell 146B, and that the profiles of respective shells 142A and 142B conform with their associated dielectric shells.

Figure 4:
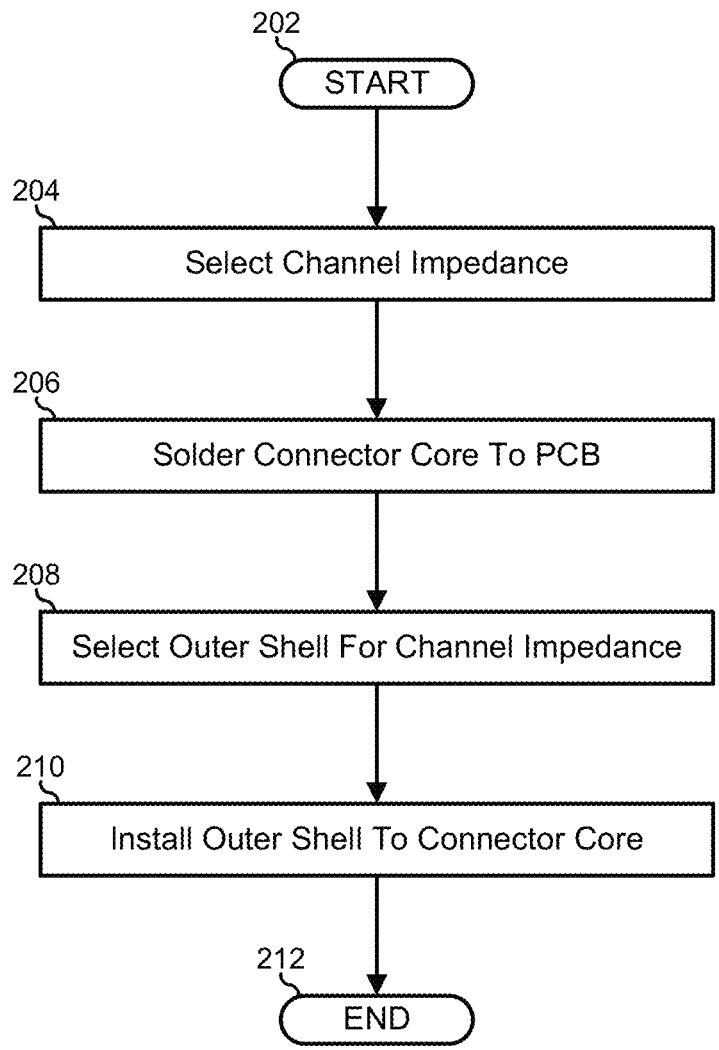
FIG. 4 is a flowchart illustrating a method for factory configuration of a connector impedance according to an embodiment of the current disclosure.

FIG. 4 illustrates a method 200 for factory configuration of a connector impedance, starting at block 202. A high-speed data interface channel impedance for a PCB of an information handling system is selected in block 204. A connector core of a two-piece connector is soldered to the PCB in block 206. An outer shell associated with the selected high-speed data interface channel impedance is selected in block 208. The selected outer shell is installed to the connector core in block 210, and the method ends in block 212.

Figure 5:
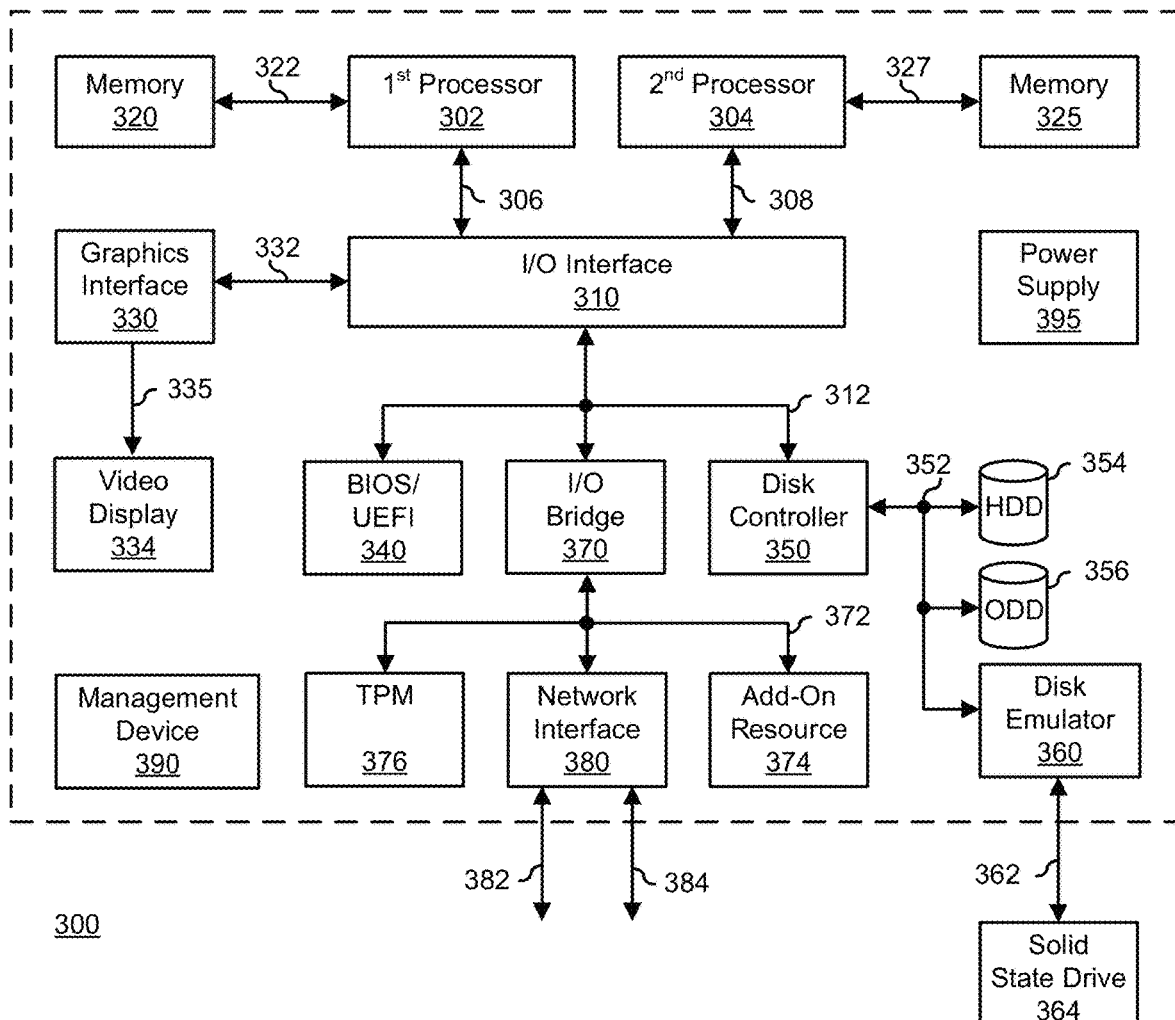
FIG. 5 is a block diagram illustrating a generalized information handling system according to another embodiment of the present disclosure.

FIG. 5 illustrates a generalized embodiment of an information handling system 300. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 300 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 300 can include processing resources for executing machine-executable code, such as a central processing unit (CPU), a programmable logic array (PLA), an embedded device such as a System-on-a-Chip (SoC), or other control logic hardware. Information handling system 300 can also include one or more computer-readable medium for storing machine-executable code, such as software or data. Additional components of information handling system 300 can include one or more storage devices that can store machine-executable code, one or more communications ports for communicating with external devices, and various input and output (I/O) devices, such as a keyboard, a mouse, and a video display. Information handling system 300 can also include one or more buses operable to transmit information between the various hardware components.

Information handling system 300 can include devices or modules that embody one or more of the devices or modules described below, and operates to perform one or more of the methods described below. Information handling system 300 includes a processors 302 and 304, an input/output (I/O) interface 310, memories 320 and 325, a graphics interface 330, a basic input and output system/universal extensible firmware interface (BIOS/UEFI) module 340, a disk controller 350, a hard disk drive (HDD) 354, an optical disk drive (ODD) 356, a disk emulator 360 connected to an external solid state drive (SSD) 364, an I/O bridge 370, one or more add-on resources 374, a trusted platform module (TPM) 376, a network interface 380, a management device 390, and a power supply 395. Processors 302 and 304, I/O interface 310, memories 320 and 325, graphics interface 330, BIOS/UEFI module 340, disk controller 350, HDD 354, ODD 356, disk emulator 360, SSD 364, I/O bridge 370, add-on resources 374, TPM 376, and network interface 380 operate together to provide a host environment of information handling system 300 that operates to provide the data processing functionality of the information handling system. The host environment operates to execute machine-executable code, including platform BIOS/UEFI code, device firmware, operating system code, applications, programs, and the like, to perform the data processing tasks associated with information handling system 300.

In the host environment, processor 302 is connected to I/O interface 310 via processor interface 306, and processor 304 is connected to the I/O interface via processor interface 308. Memory 320 is connected to processor 302 via a memory interface 322. Memory 325 is connected to processor 304 via a memory interface 327. Graphics interface 330 is connected to I/O interface 310 via a graphics interface 332, and provides a video display output 335 to a video display 334. In a particular embodiment, information handling system 300 includes separate memories that are dedicated to each of processors 302 and 304 via separate memory interfaces. An example of memories 320 and 325 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 340, disk controller 350, and I/O bridge 370 are connected to I/O interface 310 via an I/O channel 312. An example of I/O channel 312 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 310 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/UEFI module 340 includes BIOS/UEFI code operable to detect resources within information handling system 300, to provide drivers for the resources, initialize the resources, and access the resources. BIOS/UEFI module 340 includes code that operates to detect resources within information handling system 300, to provide drivers for the resources, to initialize the resources, and to access the resources.

Disk controller 350 includes a disk interface 352 that connects the disk controller to HDD 354, to ODD 356, and to disk emulator 360. An example of disk interface 352 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 360 permits SSD 364 to be connected to information handling system 300 via an external interface 362. An example of external interface 362 includes a USB interface, an IEEE 1394 (Firewire) interface, a proprietary interface, or a combination thereof. Alternatively, solid-state drive 364 can be disposed within information handling system 300.

I/O bridge 370 includes a peripheral interface 372 that connects the I/O bridge to add-on resource 374, to TPM 376, and to network interface 380. Peripheral interface 372 can be the same type of interface as I/O channel 312, or can be a different type of interface. As such, I/O bridge 370 extends the capacity of I/O channel 312 when peripheral interface 372 and the I/O channel are of the same type, and the I/O bridge translates information from a format suitable to the I/O channel to a format suitable to the peripheral channel 372 when they are of a different type. Add-on resource 374 can include a data storage system, an additional graphics interface, a network interface card (NIC), a sound/video processing card, another add-on resource, or a combination thereof. Add-on resource 374 can be on a main circuit board, on separate circuit board or add-in card disposed within information handling system 300, a device that is external to the information handling system, or a combination thereof.

Network interface 380 represents a NIC disposed within information handling system 300, on a main circuit board of the information handling system, integrated onto another component such as I/O interface 310, in another suitable location, or a combination thereof. Network interface device 380 includes network channels 382 and 384 that provide interfaces to devices that are external to information handling system 300. In a particular embodiment, network channels 382 and 384 are of a different type than peripheral channel 372 and network interface 380 translates information from a format suitable to the peripheral channel to a format suitable to external devices. An example of network channels 382 and 384 includes InfiniBand channels, Fibre Channel channels, Gigabit Ethernet channels, proprietary channel architectures, or a combination thereof. Network channels 382 and 384 can be connected to external network resources (not illustrated). The network resource can include another information handling system, a data storage system, another network, a grid management system, another suitable resource, or a combination thereof.

Management device 390 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 300. In particular, management device 390 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 300, such as system cooling fans and power supplies. Management device 390 can include a network connection to an external management system, and the management device can communicate with the management system to report status information for information handling system 300, to receive BIOS/UEFI or system firmware updates, or to perform other task for managing and controlling the operation of information handling system 300. Management device 390 can operate off of a separate power plane from the components of the host environment so that the management device receives power to manage information handling system 300 when the information handling system is otherwise shut down. An example of management device 390 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 390 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A connector, comprising:
    a connector core including a plurality of contacts for coupling a device to a printed circuit board (PCB), the connector core configured to exhibit a first impedance for signals provided on the contacts;
    a first outer shell configured to be rigidly attached to the connector core, the first outer shell including a first outer shield and a first inner dielectric shell that provides a first separation distance between the connector core and the first outer shield, such that, when the first outer shell is attached to the connector core, the connector exhibits a second impedance for signals provided on the contacts, the second impedance being different from the first impedance; and
    a second outer shell configured to be rigidly attached to the connector core, the second outer shell including a second outer shield and a second inner dielectric shell that provides a second separation distance between the connector core and the second outer shield, such that, when the second outer shell is attached to the connector core, the connector exhibits a third impedance for signals provided on the contacts, the third impedance being different from the first and second impedances.

2. The connector of claim 1, wherein the connector core is configured to be surface mount attached to the PCB.

3. The connector of claim 1, wherein the first and second outer shells are configured to be through-hole drill attached to the PCB.

4. The connector of claim 1, wherein the first outer shell includes a mounting extension configured to be inserted into a matching hole in the PCB to secure the outer shell to the connector core.

5. The connector of claim 1, wherein the first outer shell is fabricated with a first material, and the outer shell is fabricated with a second material different from the first material.

6. The connector of claim 1, wherein the first outer shell has a first profile, and the second outer shell has a second profile different from the first profile.

7. The connector of claim 1, wherein the first impedance is 110 ohms.

8. The connector of claim 7, wherein the second and third impedances each have a value selected from 85 ohms, 95 ohms, and 100 ohms.

9. An information handling system, comprising:
    a printed circuit board (PCB); and
    a connector including:
        a connector core including a plurality of contacts for coupling a device to the PCB, the connector core configured to exhibit a first impedance for signals provided on the contacts;
        a first outer shell configured to be rigidly attached to the connector core, the first outer shell including a first outer shield and a first inner dielectric shell that provides a first separation distance between the connector core and the first outer shield, such that, when the first outer shell is attached to the connector core, the connector exhibits a second impedance for signals provided on the contacts, the second impedance being different from the first impedance; and
        a second outer shell configured to be rigidly attached to the connector core, the second outer shell including a first outer shield and a first inner dielectric shell that provides a first separation distance between the connector core and the first outer shield, such that, when the second outer shell is attached to the connector core, the connector exhibits a third impedance for signals provided on the contacts, the third impedance being different from the first and second impedances.

10. The information handling system of claim 9, wherein the connector core is configured to be surface mount attached to the PCB.

11. The information handling system of claim 9, wherein the first and second outer shells are configured to be through-hole drill attached to the PCB.

12. The information handling system of claim 9, wherein the first outer shell includes a mounting extension configured to be inserted into a matching hole in the PCB to secure the outer shell to the connector core.

13. The information handling system of claim 9, wherein the first outer shell is fabricated with a first material, and the second outer shell is fabricated with a second material different from the first material.

14. The information handling system of claim 9, wherein the first outer shell has a first profile, and the second outer shell has a second profile different from the first profile.

15. The information handling system of claim 9, wherein the first impedance is 110 ohms.

16. The information handling system of claim 15, wherein the second and third impedances each have a value selected from 85 ohms, 95 ohms, and 100 ohms.

* * * * *